United States Patent [19]

Buckley

[11] Patent Number: 4,472,824

[45] Date of Patent: Sep. 18, 1984

[54] APPARATUS FOR EFFECTING ALIGNMENT AND SPACING CONTROL OF A MASK AND WAFER FOR USE IN X-RAY LITHOGRAPHY

[75] Inventor: W. Derek Buckley, Easton, Conn.

[73] Assignee: The Perkin-Elmer Corporation, Norwalk, Conn.

[21] Appl. No.: 405,207

[22] Filed: Aug. 4, 1982

[51] Int. Cl.$^3$ .................... G02B 27/00; H01L 21/30
[52] U.S. Cl. .................... 378/34; 250/491.1; 378/205
[58] Field of Search .................... 378/34, 35, 205; 250/491.1

[56] References Cited

U.S. PATENT DOCUMENTS 4,335,313  6/1982  Kreuzer et al. .................... 378/34

Primary Examiner—Alfred E. Smith
Assistant Examiner—T. N. Grigsby
Attorney, Agent, or Firm—T. P. Murphy; E. T. Grimes

[57] ABSTRACT

This invention relates to apparatus for effecting alignment and spacing control of a mask and wafer for use, for example, in x-ray lithography, which includes, in combination, two optical channels for effecting lateral and vertical alignment at two spaced alignment targets respectively on the element, two spaced position sensors located on a line which is oblique with respect to a line joining the two alignment targets, and linkage for maintaining the distances between the position sensors and the element equal one to the other.

4 Claims, 7 Drawing Figures

APPARATUS FOR EFFECTING ALIGNMENT AND SPACING CONTROL OF A MASK AND WAFER FOR USE IN X-RAY LITHOGRAPHY

BACKGROUND OF THE INVENTION

The present conventional method of manufacturing integrated circuits involves photolithographic replication of patterns from a mask onto a silicon wafer surface, which has been treated with a photoresist material. Each such step is followed by conventional procedures such as developing, etching, etc. These steps may be repeated a number of times on a single wafer, each pattern overlying patterns previously applied. With increasing miniaturization, the pattern elements have become smaller and smaller to the extent that pattern resolution is limited by the wavelength of light. This has already led to the use of the shorter wavelengths of the ultraviolet spectrum. The successor technology appears to be x-ray lithography.

One of the problems which will arise in the use of x-ray lithography is that the procedures for aligning the masks and wafers are intricate and time consuming.

One system for aligning an opaque mask with an integrated circuit wafer is described in U.S. Pat. application Ser. No. 149,106 filed May 12, 1980 and now U.S. Pat. No. 4,335,313, wherein an opaque lithographic mask is aligned to a substrate wafer by providing three alignment targets on one surface of each of the mask and the wafer. Three microscope optical channels are positioned to view portions of a reference plane. The wafer is positioned with its alignment targets in the reference plane. The optical axis of each of the optical channels is aligned with a different one of the three targets on the wafer. The wafer is then displaced from the reference plane to an exposure plane parallel to the reference plane, while retaining its alignment relative to the optical axes. This displacement provides a known mask to wafer gap. The mask is placed in the reference plane and is positioned to align each of its three alignment targets with one of the optical axes without changing the alignment of the axes. The mask and wafer are then transported to an exposure station while retaining the alignment therebetween.

It is an object of the present invention to provide a new and improved apparatus for effecting alignment and spacing control between a mask and wafer for use in x-ray lithography, which overcomes or at least mitigates a number of the problems encountered by such prior art apparatus.

SUMMARY OF THE INVENTION

Briefly, my invention contemplates, in one form thereof, the provision of a new and improved apparatus for effecting alignment and spacing control of a mask and/or wafer element for use in x-ray lithography which includes, in combination, two optical channel means for effecting lateral and vertical alignment at two spaced alignment targets respectively on said element. In addition, two spaced sensors are located on a line which is oblique with respect to a line joining the aforementioned two alignment targets, and means are provided for maintaining the distances between the position sensors and the element equal to each other. Preferably, in one form of the invention, the spaced position sensors are located on a line which is perpendicular to the line joining the two alignment targets. Also preferably, the element is substantially circular and the line joining the two alignment targets passes through the center of the element. Further, preferably, the position sensors are substantially equal distance from the line joining the two alignment targets.

There has thus been outlined rather broadly the more important features of the invention in order that the detailed description that follows may be better understood, and in order that the present contribution to the art may be better appreciated. There are, of course, additional features of the invention which will be described more fully hereinafter. Those skilled in the art will appreciate that the conception on which this disclosure is based may readily be utilized as a basis for other apparatus for carrying out the several purposes of the invention. It is important, therefore, that this disclosure be regarded as including such equivalent apparatus as do not depart from the spirit or scope of the invention.

Several embodiments of the invention have been chosen for purposes of illustration and description and are shown in the accompanying drawings, forming a part of the specification.

DETAILED DESCRIPTION OF THE INVENTION

Figure 1:
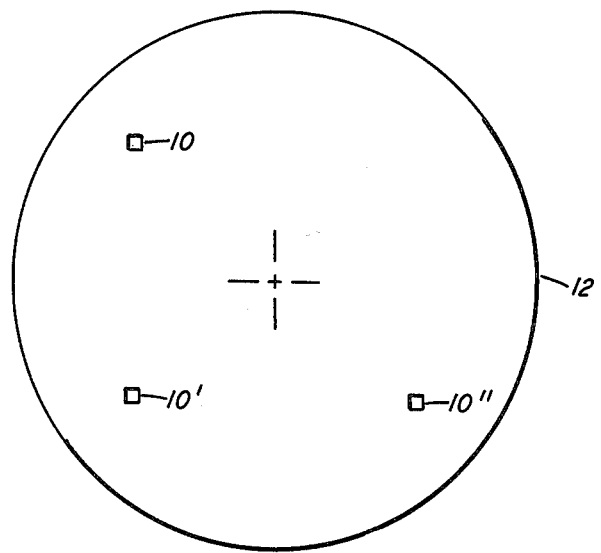
FIG. 1 is a plan view of a mask or wafer element having three L-configured alignment targets, according to the prior art.

In x-ray lithography it is necessary to align the mask and wafer in six degrees of freedom prior to exposure by the x-ray source. FIG. 1 shows a typical prior art system for effecting this procedure. In order to perform lateral and vertical alignment, an alignment fixture may incorporate three identical alignment channel targets 10, 10' and 10" arranged in an "L" shape on a mask or wafer element 12 as shown in FIG. 1 and described in detail in the aforementioned U.S. patent application Ser. No. 149,106, filed May 12, 1980 and now U.S. Pat. No. 4,335,313. Although this arrangement is redundant for simple lateral and vertical alignment, it has the capability of measuring magnification in two orthogonal lateral directions and making a first-order correction for elliptical wafer distortions by tilting the mask with respect to the wafer.

Figure 2:
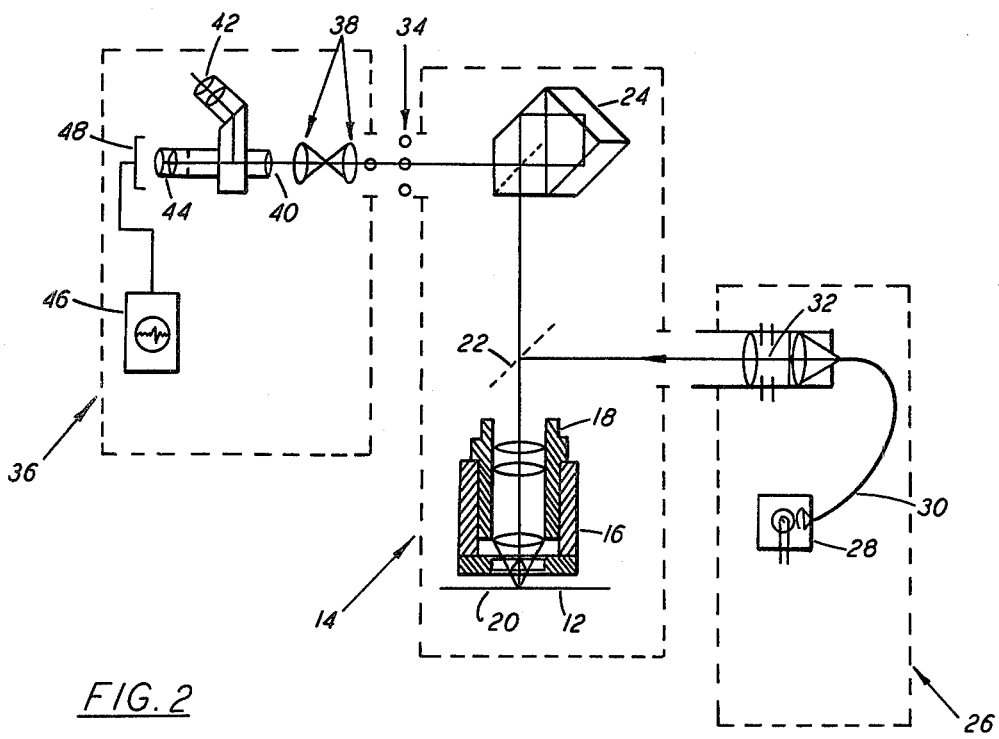
FIG. 2 is a schematic side elevation of a mask or wafer alignment channel.

In order to effect the lateral and vertical alignment, three alignment channels were used, one for each alignment channel target 10, 10', 10". One of the three alignment channels is indicated at 14 in FIG. 2. This channel includes an interferometer 16, having an objective 18 mounted adjacent the mask or wafer element 20. The channel further includes a beam splitter 22 and a lateral alignment prism 24. Each alignment channel 14 is provided with an illuminator indicated at 26 in FIG. 2. The illuminator comprises a Tungstem Halogen lamp 28, which is connected by a fibre optical cable 30 to a UV-Blue Blocking filter 32 from which light is directed to the beam splitter 22 of the alignment channel. The output of one selected alignment channel 14 at a time is passed through a three to one switch 34 to an output system indicated generally at 36 in FIG. 2. This output system comprises a relay/telescope 38, tube lens 40 and eyepieces 42 and 44. The alignment may be effected manually by the operator by observations through eyepiece 42 or automatic means may be employed using an oscilloscope display through a gauge 46 and photoelectric detector 48 from the eyepiece 44. The optical channel permits visual inspection of the alignment target 10, 10′, 10″ of FIG. 1 and by means of the combined interferometer objective permits simultaneous determination of the location of the wafer or mask plane. That is, lateral alignment is accomplished by means of the microscope and prism assembly, and vertical alignment by means of the microscope and interferometer.

Figure 3A:
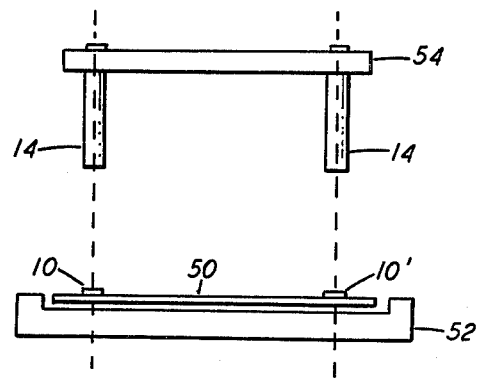
FIGS. 3a and 3b are schematic side elevational views showing the sequential procedure for aligning the mask and wafer.
Figure 3B:
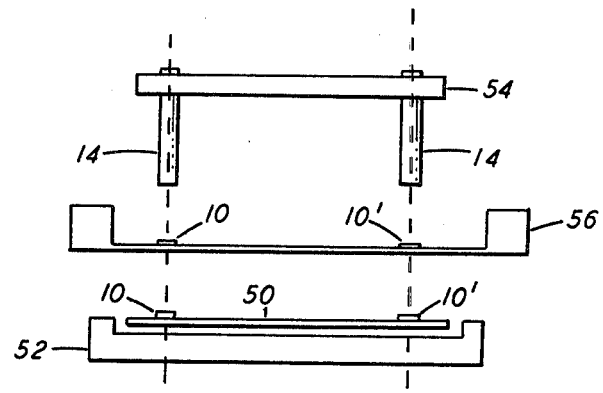

In view of the fact that the mask in x-ray lithography may be opaque, special procedures are required to effect the alignment of the mask and wafer. FIGS. 3a and 3b illustrate the alignment procedure for opaque masks. The first step as seen in FIG. 3a is to place a wafer 50 having alignment targets 10, 10′ (only two of the three being shown) in a vacuum chuck 52 and vertically or axially aligning it with respect to a reference plane 54 by means of the alignment channels 14. Then the wafer is laterally aligned with respect to the reference plane 54 along the three (two being shown) alignment channels 14. The next step, as seen in FIG. 3b, is to interpose the mask 56 between the reference plane 54 and the wafer 50. The mask is vertically aligned with respect to the reference plane, and then it is laterally aligned with respect to the reference plane along the three (two being shown) alignment channels 14. As illustrated in FIGS. 3a and 3b the mask is aligned at a different distance from the reference plane 54 than the wafer and, hence, the alignment channel 14 must have two different focal points. If the alignment channel 14 has only one focal point, then after vertically aligning the wafer at a first spacing with respect to the reference plane it could then be moved a fixed preselected distance downwardly and the mask then aligned with respect to the reference plane at said first spacing. In either case the mask and wafer are then transported together to an exposure station (not shown).

Figure 4:
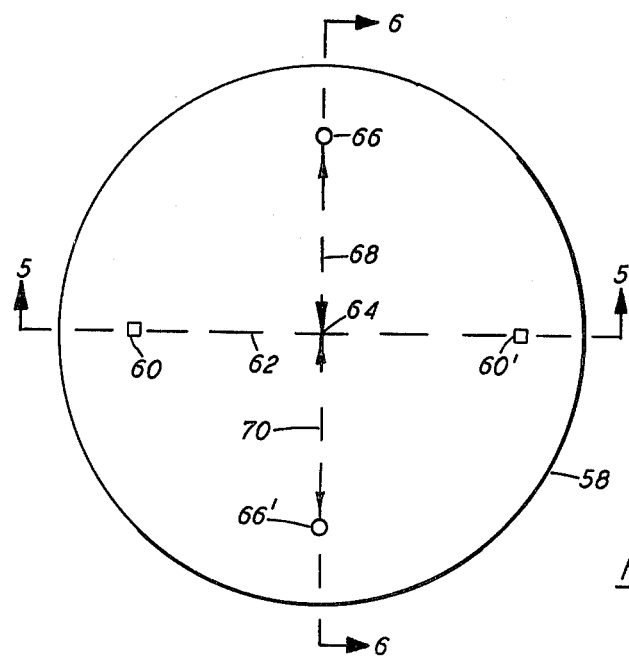
FIG. 4 is a plan view of a mask or a wafer element having two alignment targets and two spacing sensors according to the invention.

Now, in order to simplify and speed-up the foregoing procedure, the present invention provides a new and improved apparatus for effecting alignment and spacing control of a mask or wafer for use in x-ray lithography. Referring to FIG. 4, the wafer or mask element 58 is provided with two alignment channel targets 60, 60′. In this system only two alignment targets are employed and these are preferably located on a line 62 which passes through the center 64 of the element 58. In addition, two spaced position sensor spots 66 and 66′ are located on a line 68–70 which is oblique with respect to the line 62 joining the two alignment targets 60, 60′. Preferably, the line 68–70 is perpendicular to the line 62 and preferably the distance 68 between the sensor 66 and the center 64 is substantially equal to the distance 70 between the sensor 66′ and the center 64.

Figure 5:
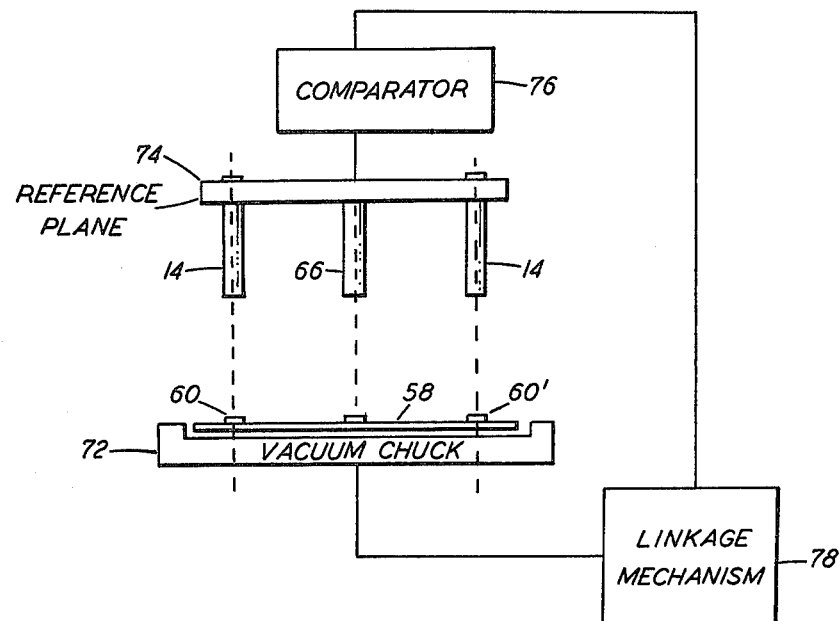
FIG. 5 is a schematic side elevation taking along the line indicated at 5—5 in FIG. 4.
Figure 6:
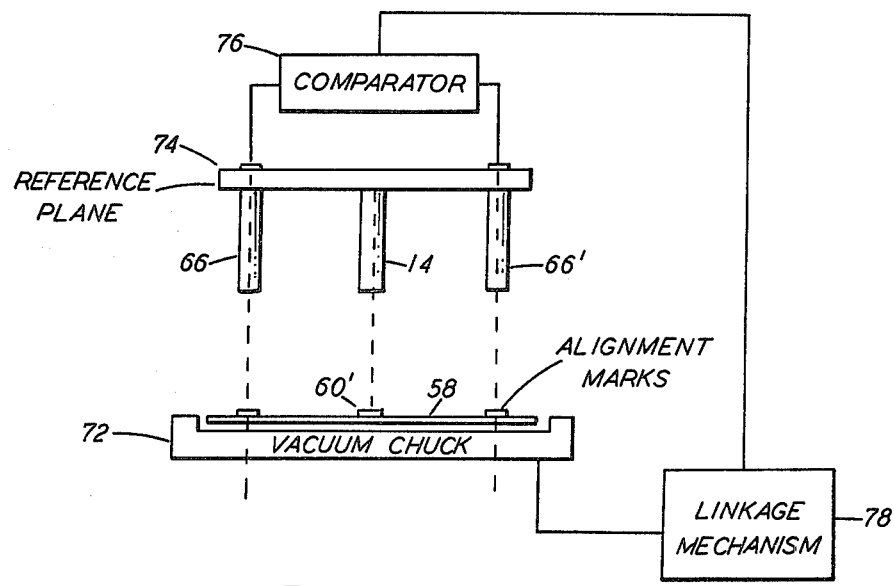
FIG. 6 is a schematic side elevation taking along the line indicated at 6—6 in FIG. 4.

In operation, as seen in FIGS. 5 and 6, the first step is to place an element 58, which may be the wafer, having two alignment targets 60, 60′ in a vacuum chuck 72 and vertically aligning it with respect to a reference plane 74 along the alignment channels 14. At the same time the element 58 is laterally aligned with respect to the reference plane 74 along the two alignment channels 14. It is noted that the use of a reference plane is a specific solution. It could be eliminated and the lateral and vertical position of the optical channels used in place thereof.

Simultaneously, with the above-described alignment operations, or subsequently thereto, the position sensor 66 senses the distance between the reference plane 74 and the element 58 and the position sensor 66′ senses the distance between the reference plane 74 and the element 58 and transmits corresponding signals, respectively, to a comparator 76 which controls a linkage mechanism 78 to maintain the distance equal. As a result, the spacing determination is accomplished at the two alignment target locations, and the pair of position sensors are used to set the element parallel to the reference plane. Any suitable type of sensors may be employed such as, for example, Kaman eddy current sensors, air gauge displacement sensors, white light interferometer, focus, fibre optic displacement sensors or acoustic sensors. It will be particularly appreciated that the sensors operate so that the two distances are set equal, but without precise absolute measurement. This type of operation can readily be automated and rapidly be effected.

If the mask is opaque, a procedure similar to that described hereinbefore in connection with FIGS. 3a and 3b may be employed. That is, the waver is aligned with respect to the reference plane 74, as shown in FIGS. 5 and 6, and then the mask is inserted between the reference plane and the wafer. However, if the mask is not opaque then the reference plane 74 may be dispensed with and the wafer and mask aligned directly with respect to each other.

It will thus be seen that the present invention does indeed provide a new and improved apparatus for effecting alignment and spacing control between a mask and wafer for use in x-ray lithography, which effectively meets the object specified hereinbefore.

Although certain particular embodiments of the invention are herein disclosed for purposes of explanation, further modification thereof, after studying this specification, will be apparent to those skilled in the art to which the invention pertains.

Reference should accordingly be had to the appended claims in determining the scope of the invention.

What is claimed is:

1. Apparatus for effecting alignment and spacing control of a mask or wafer element for use in x-ray lithography comprising, in combination, two optical channel means for effecting lateral and vertical alignment at two spaced alignment targets respectively on said element, two spaced position sensors located on a line which is oblique with respect to a line joining said two alignment targets, and means for maintaining the distances between the position sensors and the element equal to each other.

2. Apparatus for effecting alignment and spacing control of a mask or wafer element for use in x-ray lithography comprising, in combination, two optical channel means for effecting lateral and vertical alignment at two spaced alignment targets respectively on said element, two spaced position sensors located on a line which is perpendicular to a line joining said two alignment targets, and means for maintaining the distances between the position sensors and the element equal to each other.

3. Apparatus according to claim 2 wherein said position sensors are of substantially equal distance from the line joining the two alignment targets.

4. Apparatus according to any one of claims 1, 2 or 3 wherein said element is substantially circular and said line joining said two alignment targets passes through the center of the element.

* * * * *